United States Patent [19]

Double et al.

[11] 4,093,912
[45] June 6, 1978

[54] NMR MAGNET ASSEMBLY WITH POLE FACE PARALLELISM ADJUSTMENT

[75] Inventors: Glen P. Double; Vincent N. Kahwaty, both of Poughkeepsie; James D. Randall, Pleasant Valley; Fritz M. Reinhart, Hopewell Junction, all of N.Y.

[73] Assignee: International Business Machines Corporation, Armonk, N.Y.

[21] Appl. No.: 724,798

[22] Filed: Sep. 20, 1976

[51] Int. Cl.² ............................................. G01R 33/08
[52] U.S. Cl. ................................ 324/.5 MA; 335/298
[58] Field of Search ............................ 335/287, 298; 324/.5 MA, .5 R, 345; 350/285

[56] References Cited

U.S. PATENT DOCUMENTS

| 3,588,230 | 6/1971 | Rieux | 350/285 |
| 3,611,223 | 8/1971 | Utsumi | 335/298 |

FOREIGN PATENT DOCUMENTS 946,340   1/1964   United Kingdom ........... 324/.5 MA Primary Examiner—M. Tokar
Attorney, Agent, or Firm—Douglas R. McKechnie

[57] ABSTRACT

A nuclear magnetic resonance (NMR) magnet assembly includes two pole faces spaced to provide a gap in which is established a uniform magnetic field. The pole pieces have pole faces that are flat and parallel. The pole pieces are mounted on support plates one of which is fixed and the other of which is movable about a pivot point with two degrees of freedom of movement in response to adjustment of two adjustable mechanisms. Each adjustment mechanism includes a differential screw that produces a transverse movement and a longitudinally inclined pin or pins that translates such transverse movement into a much greatly reduced longitudinal movement. The combination of a differential screw and inclined pin provides a very fine adjustment of the parallelism of the pole faces. Each mechanism further includes means for providing a coarse adjustment.

12 Claims, 7 Drawing Figures

NMR MAGNET ASSEMBLY WITH POLE FACE PARALLELISM ADJUSTMENT

SUMMARY OF THE INVENTION

1. Field of the Invention

This invention relates to a nuclear magnetic resonance (NMR) magnet assembly having flat parallel pole faces and, more particularly, to improvements in the mechanisms for adjusting the parallelism of such pole faces.

2. Prior Art

High resolution NMR spectrometers are known which utilize a permanent magnet having flat parallel pole faces defining a gap therebetween in which gap exists a homogeneous magnetic field. It is known that the homogeneity of such field is affected by many factors including the degree of flatness of the pole faces and the parallelism thereof. The prior art thus recognizes the dependence of field homogeneity upon pole face parallelism and includes different mechanisms for adjusting such parallelism. In one type of mechanism, collars surround the pole faces of the permanent magnet and differential screws are connected to the collars and extend in a longitudinal direction parallel to the axis of the pole faces. By rotating the screws, the longitudinal distances between the collars can be varied to adjust the parallelism of the pole faces. Examples of mechanisms of this type are disclosed in IBM Technical Disclosure Bulletin, Vol. 18, No. 1 (June 1975), Page 188, and in Acta Obstetrica et Gynecologica Scandinavia, Vol. XLV, Supp. 2., Eric Obeblad Stockholm (1966), Pages 68, 69. There are also commercially available NMR spectrometers using screw adjustment mechanisms similar to those described in these articles.

The article "Adjustment of the Homogeneity of a Permanent Magnet for High-Resolution Nuclear Magnetic Resonance", by A. P. McCann et al, Journal of Scientific Instruments, Vol. 39 (1962), Pages 349–351, describes a magnet assembly in which one pole face is spaced a small distance from a permanent magnet core to allow a small amount of relative movement. The pole face is attached to a collar which is attached to three wedges connected to radial screws. Upon rotation of a wheel, the screw moves radially and the wedge translates such movement into a longitudinal motion that pivots the pole face to affect its parallelism.

SUMMARY OF THE INVENTION

One of the objects of the invention is to provide an NMR magnet assembly having a pole piece sub-assembly provided with a mechanism for making extremely fine adjustments in the parallelism of the pole faces.

Another object is to provide a pole piece sub-assembly which can be sub-assembled and preliminarily adjusted prior to assembling it into the magnet assembly.

A further object is to provide a pole piece adjustment mechanism with at least 2° of freedom of movement or adjustment about a fixed pivot.

Still another object is to provide a pole face parallelism adjustment mechanism for an NMR magnet assembly in which final adjustment can be made during operation of the associated NMR spectrometer.

Briefly, the invention comprises two support plates connected to the pole pieces of a permanent magnet assembly. One of the support plates is affixed to part of the magnet assembly and the other plate is pivotably mounted on the first plate. Two adjustment mechanisms interconnect the support plates. Each adjustment mechanism comprises a differential screw that produces a radial or transverse movement of one of the parts and a pin which is inclined longitudinally at a slight angle so that the transverse movement is translated into a much lesser or finer degree of longitudinal movement for pivoting the support plate and associated pole face.

Other objects and advantages of the invention will be apparent from the following description taken in connection with the accompanying drawings wherein.

Figure 1:
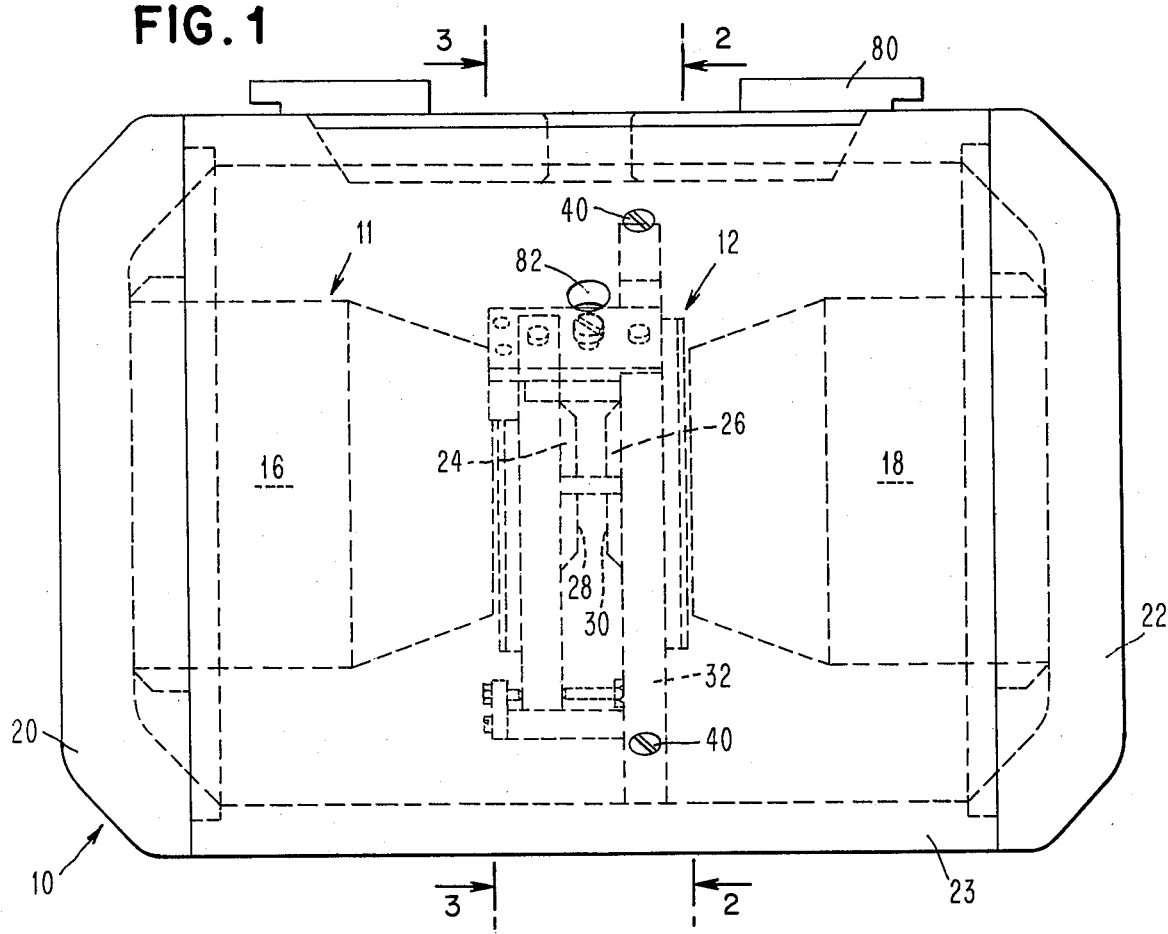
FIG. 1 is a side elevational view of an NMR magnet assembly embodying the invention.
Figure 2:
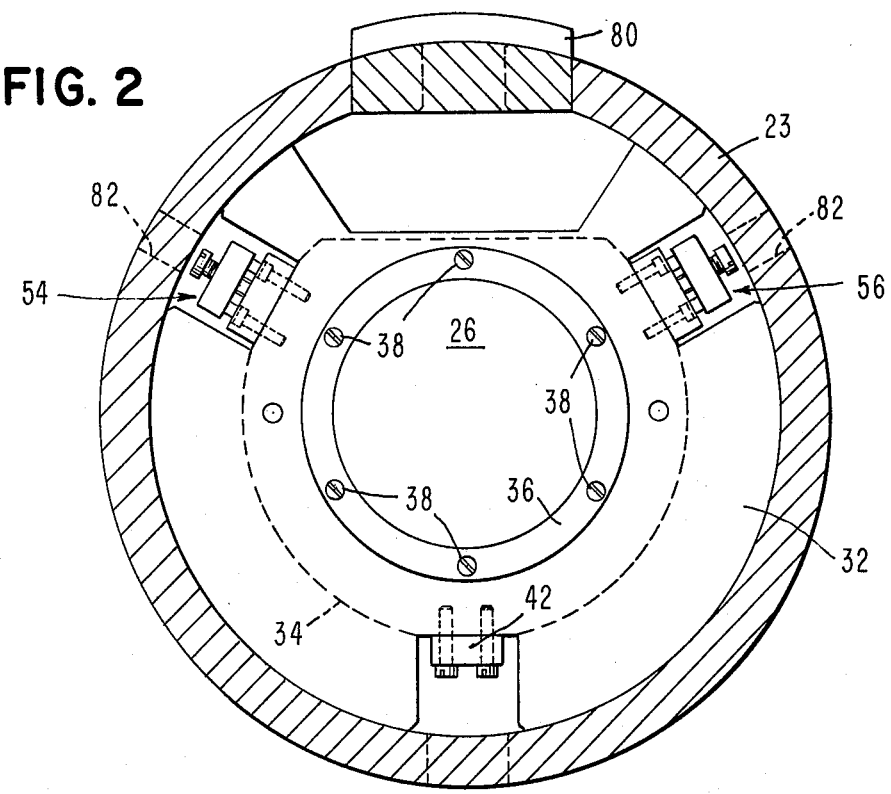
FIG. 2 is a transverse cross-sectional view through the magnetic assembly shown in FIG. 1 taken along reference line 2—2.
Figure 3:
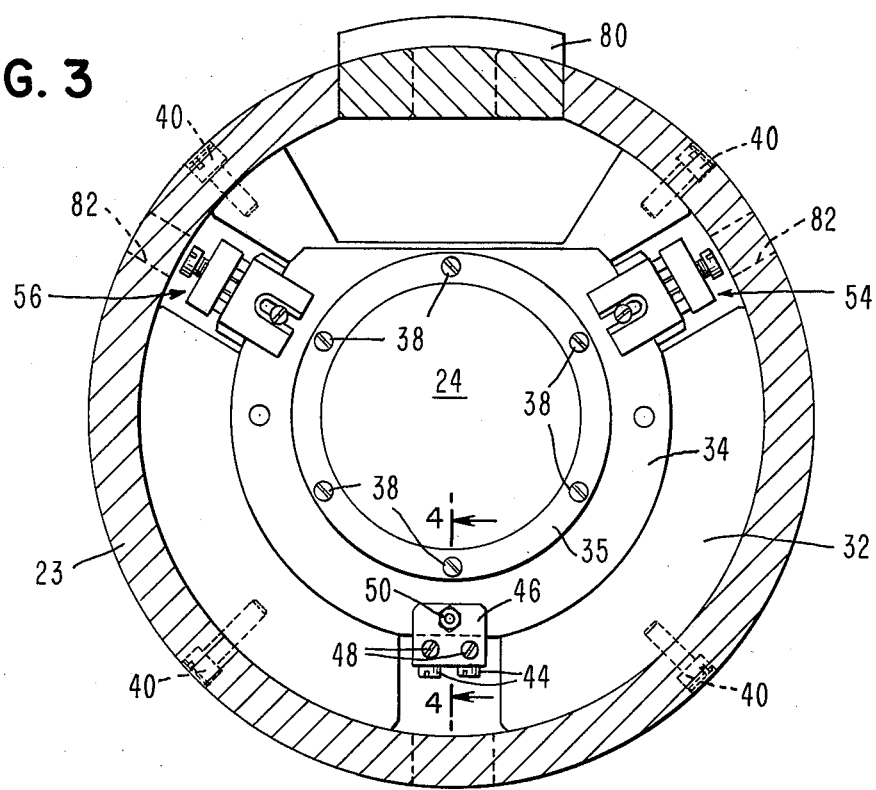
FIG. 3 is a transverse cross-sectional view of the magnet assembly of FIG. 1 taken along reference lines 3—3.
Figure 4:
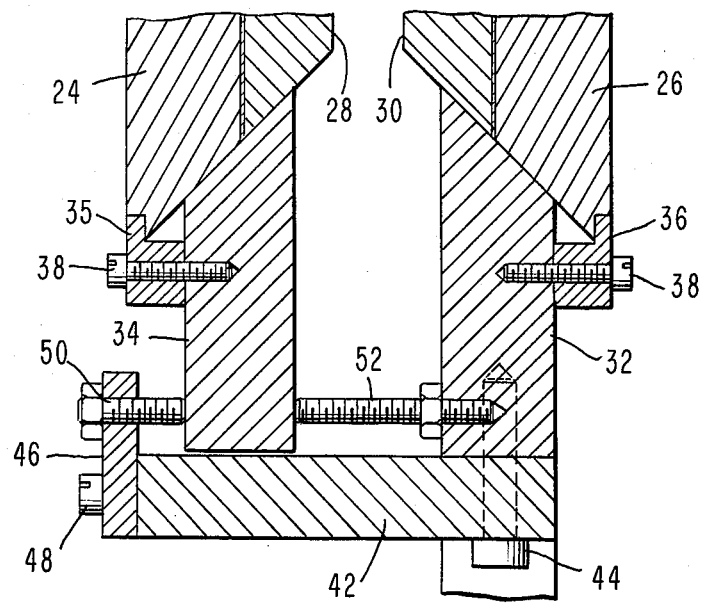
FIG. 4 is an enlarged longitudinal sectional view of a detail taken along reference lines 4—4 of FIG. 3.

Referring now to the drawings, and first to FIG. 1, there is shown an NMR magnet assembly 10 that is of a generally cylindrical external shape and includes a permanent magnet 11 and a pole piece sub-assembly 12. Magnet assembly 10 provides a homogeneous magnetic field into which a probe and sample (not shown) may be inserted for analyzing the sample through conventional NMR spectrometic techniques. Permanent magnet 11 includes two cores 16 and 18 of a permanent magnet material such as Alnico, the poles being joined to end plugs or caps 20 and 22. These caps are connected to and cover the ends of a cylindrical casing 23 which encloses cores 16 and 18, pole pieces 24 and 26, and sub-assembly 12. Caps 20 and 22 and casing 23 are of a magnetic material having a low magnetic reluctance such as soft iron to provide a return path for a magnetic field generated by cores 16 and 18. Cores 16 and 18 are cylindrical and lie along a common axis. Pole pieces 24 and 26 are disposed between cores 16 and 18 and have conical frustrum shapes coaxial with the axis of the poles and casing. The pole pieces have adjacent pole faces 28 and 30 that are circular, flat, and parallel to each other. Pole faces 28 and 30 are separated by a distance of about 0.5 inches (1.3 cm) to provide a gap containing the uniform magnetic field for analyzing a sample. The pole pieces 24 and 26 are spaced from cores 16 and 18 a distance of about 0.01 inches (0.025 cm), the space between core 16 and pole piece 24 allowing slight pivotal movement of polepiece 24 relative to core 16. Pole pieces 24 and 26 are held in this spaced relationship in sub-assembly 12 against the forces of magnetic attraction.

Except for pole pieces 24 and 26, sub-assembly 12 is made of non-magnetic material such as aluminum, brass or non-magnetic stainless steel. The sub-assembly includes a fixed plate 32 and a movable or adjustable plate 34 which extend generally parallel to each other transversely across the interior of casing 32 and coaxial therewith. Both plates are in a form of circular rings concentric to pole pieces 24 and 26. Pole piece 24 is connected rigidly to plate 34 by means of an annular collar 35 and screws 38, and pole piece 26 is rigidly connected to plate 32 by an annular collar 36 and screws 38. Plate 32 is rigidly connected to casing 23 by four equally spaced screws 40.

A block 42 is connected by screws 44 to plate 32 and extends longitudinally from plate 32 beneath plate plate 34. An end plate 46 is attached to the end of block 42 and carries a pivot pin 50 that engages plate 34 near the bottom edge thereof. A second pivot pin 52 is connected to plate 32 and abuts plate 34 to thus provide in conjunction with pin 50 a pivot about which plate 34 is adjustable with two degrees of freedom of movement as described in detail below. Pivot pins 50 and 52 are externally threaded and are threadedly received in threaded holes in plates 46 and 32 and held in place by lock nuts.

Figure 5:
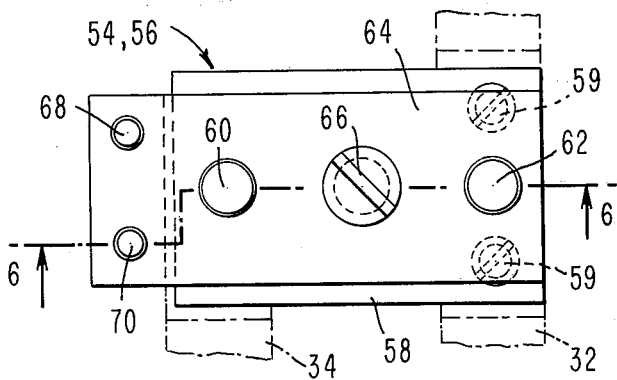
FIG. 5 is a top plan enlarged detail view of an adjustment mechanism.
Figure 6:
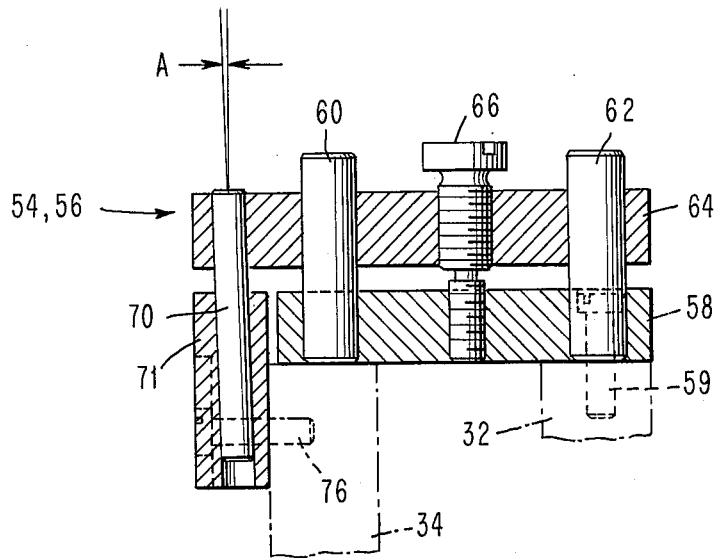
FIG. 6 is a longitudinal sectional view along reference line 6—6 of FIG. 5.
Figure 7:
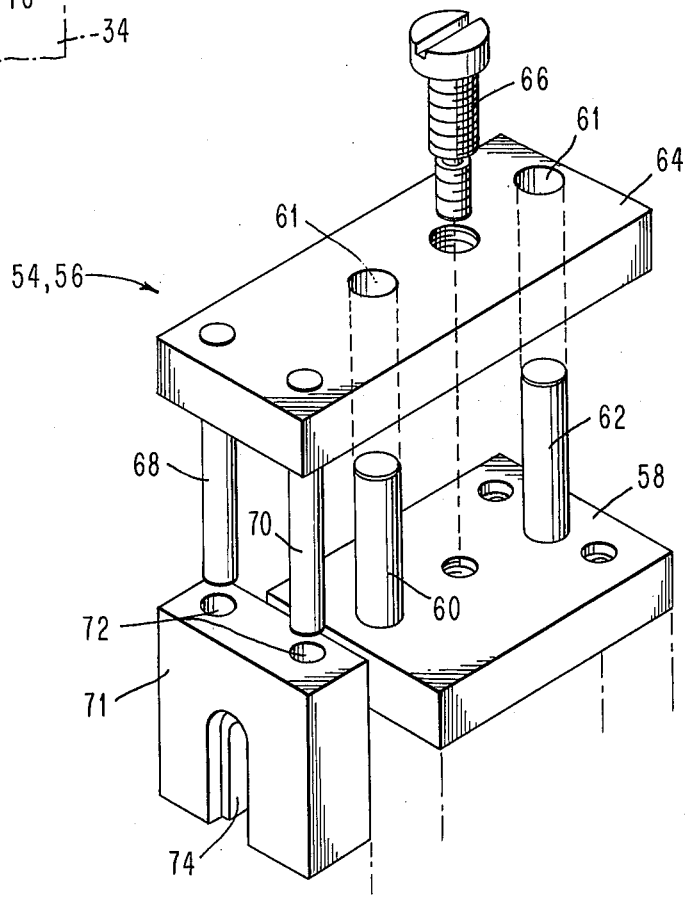
FIG. 7 is an enlarged exploded view of one of the adjustment mechanisms shown in FIG. 3.

Two adjustment mechanisms 54 and 56 are included in sub-assembly 12 and are spaced at positions angularly spaced from pivot pins 50 and 52, the adjustment mechanisms being operative, as discussed in more detail hereinafter, to adjust the position of plate 34, and hence the position or angular alignment of pole face 28, with two degrees freedom of movement about the pivot and relative to pole face 30. Each adjustment mechanism 54, 56 is identical and is best seen in the enlarged detailed views of FIGS. 5-7, to which reference may now be had.

A fixed block 58 is connected by screws 59 to fixed plate 32 and extends longitudinally thereof to radially overlay the periphery of movable plate 34. A small space is provided between block 58 and plate 34 to allow a free sliding movement therebetween. Two longitudinally spaced, parallel, generally radially extending guide pins 60 and 62 have their radially inward ends press fitted into block 58 and are slidingly received in bores 61 of a movable block 64. A differential screw 66 is located between pins 60 and 62 and is parallel thereto. This screw contains a coarse thread and fine thread that may be for example, 20 and 24 threads per inch (7.9 and 9.4 threads per centimeter) respectively. The threads are received in similarly threaded bores in blocks 58 and 64 whereby rotation of screws 66 is operative to move block 64 in a radial direction by a distance that is proportional to the degree of rotation of screw 66 and the difference between the pitches of the threads on the differential screw. Screw 66 also functions to connect block 64 to block 58. As in known, a differential screw provides a fine degree of movement proportional to the difference in pitches of the threads. For example, with the respective threads cited above, the movement will be in the order of 8 mils (0.02 centimeters) for each full rotation of screw 66.

Block 64 extends longitudinally and it carries on its end away from plate 32 two laterally spaced pins 68 and 70 that are press fitted into blocks 64. These pins are slideably received in bores 72 of a block 71 that is mounted on plate 34 by a bolt 76. Bolt 76 extends through a radially extending slot 74. As shown with reference to pin 70 in FIG. 6, each of pins 70 and 68 has a slight longitudinal angle of incline A, which is preferably two degrees, to provide a slight incline whereby the radial movement of block 64 and pins 68 and 70, causes block 71, to move longitudinally and thereby pivot plate 34, pole piece 24 and pole face 28. The extent of longitudinal movement is according to the laws of trigonometry proportional to the tangent of the angle of inclination of the pins. Because this angle is very small, the pins translate the greater radial movement into a much smaller longitudinal movement. Thus, where the radial movement for the given example is 8 mils for each full revolution of screws 66, these 8 mils are translated or reduced to a longitudinal movement of about 280 micro inches (0.0007 centimeters). As will be appreciated, each differential screw 66 can be rotated to any degree so that extremely fine adjustments can be made.

In the course of constructing magnet assembly 10, it is expected that sub-assembly 12 would be sub-assembled prior to insertion into casing 23. Such process includes making a preliminary parallelism adjustment of pole faces 20 and 30 using, e.g., suitable optical or mechanical measuring devices. Thereafter, sub-assembly 12 is assembled in casing 23 the magnet assembly is assembled in the spectrometer, and a coarse parallelism adjustment is made. To accomplish this adjustment, magnet assembly 10 includes a lid or cover 80 removably fitted into a rectangular opening into the top of casing 23. When cover 80 is removed, bolts 76 and blocks 71 are accessible. In the course of making coarse adjustments of the parallelism of the pole faces, it is expected and preferred that the NMR spectrometer itself be used to take readings on a test sample whereby adjustments can be made while measurements are taken of a known sample that will produce peaks that can be visually observed on the output of the spectrometer so that the adjustment can be made noting the height and width of the peak. The adjustments are made to produce a maximum height, minimum width peak reading. The adjustments are made by loosening bolts 76 and moving blocks 71 radially inwardly and outwardly. Such movement is effective to pivot plate 34 and hence pole face 28 to thereby vary the degree of parallelism. Such coarse adjustments would be used to produce the narrowest peak as can be done by this method. Bolts 76 would then be retightened. However, such adjustment, because of the sensitivity of the spectrometer to the parallelism of the pole faces, is generally too coarse and not precise enough for the eventual operation of the equipment. Thus, once the coarse adjustments have been made, a fine adjustment is thereafter made as described below.

To permit the fine adjustment, casing 23 is provided with two radial holes 82 that are aligned with differential screws 56 to permit screw drivers or other tools to be inserted into the holes, engaged with the screws and turned so as to adjust the pole face parallelism.

In the preferred method of making the fine adjustment, screws 56 are alternately adjusted, one-at-a-time. Each screw is rotated until the width of the measured peak is minimized. The adjustments of screws 56 is alternated until there is no further reduction in the peak width. The adjustments can be made to achieve about a five microinch (0.13 micron) degree of parallelism for a three inch (7.6 cm) diameter pole face.

Another advantage of the invention to be noted is that pole pieces 24 and 26 are positioned and supported by sub-assembly 12 independent of the mechanical tolerances of the permanent magnet.

While only a single preferred embodiment has been illustrated, it should be apparent to those skilled in the art that changes can be made in the details and arrangements of parts without departing from the scope of the invention as defined in the appended claims.

What is claimed is:

1. In an NMR magnet assembly having a permanent magnet including two spaced cylindrical magnetic cores and a cylindrical hollow flux-return-path casing surrounding said cores, the combination therewith of a pole piece sub-assembly enclosed in said casing and comprising:

two pole pieces supported between said cores and spaced therefrom and from each other, said pole pieces having flat parallel pole faces spaced to provide a gap having a homogeneous magnetic field;

a fixed support connected to said casing and supporting one of said pole pieces in a fixed position relative to said cores;

a pivotable support pivotably connected to said fixed support and supporting the other one of said pole pieces whereby said pole face thereof is pivotable about a pivot with two degrees of freedom of movement; and two adjustment mechanisms connected between said supports for positioning of said pivotable pole face in accordance with said two degrees of freedom of movement respectively;

each of said adjustment mechanisms comprising a first member movable radially of said pivotable pole face, a differential screw connected between said first member and one of said supports and operative to move said first member radially in response to rotation of said screw, and a second member extending radially between said first member and the other one of said supports, said second member having a slight longitudinal angle of incline for translating radial movement of said first member into pivotal movement of said movable pole face in one of said degrees of freedom of movement.

2. The combination of claim 1 wherein said casing has two holes therein aligned with said differential screws whereby such screws can be manually adjusted from the exterior of said casing.

3. The combination of claim 2 wherein said fixed support comprises a generally circular ring shaped plate rigidly attached at its outer edge to said casing and extending generally radially across the inside of said casing.

4. The combination of claim 3 wherein said movable support includes a generally circular ring shaped second plate connected to said other pole piece, said pivot being engaged with said second plate near the periphery of said second plate, and said adjustment mechanisms being connected to said second plate at locations equiangularly spaced from said pivot.

5. The combination of claim 1 wherein said differential screws provide for a fine adjustment, and said adjustment mechanisms further comprise means providing a coarse adjustment.

6. The combination of claim 5 wherein said coarse adjustment means comprises a third member engaged with said second member and being selectively movable in a radial direction whereby said second member translates such movement into a pivotal movement of said pole face in said one of said degrees of freedom of movement.

7. The combination of claim 1 wherein each of said adjustment mechanisms comprises a guide pin connected to said first member for guiding the radial movement thereof.

8. The combination of claim 1 wherein each second member comprises a pin rigidly connected to one of said first member or said other support, the other of said first member or said other support having a hole therein slidingly receiving said pin, said hole having the same longitudinal angle of incline as said pin.

9. In an NMR magnet assembly having a permanent magnet including two cylindrical cores, two frustum shaped pole pieces disposed between said cores in spaced relationship thereto and to each other, an a hollow cylindrical casing enclosing said cores and pole pieces, said pole pieces having flat parallel pole faces spaced to provide a gap for receiving a sample to be analyzed, non-magnetic apparatus for supporting said pole pieces and adjusting the parallelism of said pole faces, said apparatus and said pole pieces forming a sub-assembly enclosed in said casing and comprising the combination of:

first support means rigidly connected to said casing and immovably supporting one of said pole pieces;

second support means connected to the other one of said pole pieces;

means connecting said second support means to said first support means, said connecting means comprising a pivot connected to said second support means and forming a fixed pivot point about which said second support means is adjustably pivotable;

and first and second adjustment means connected between said first and second support means at locations spaced from each other and from said pivot point to provide two degrees of direction of adjustment of said second support means and of the pole face of the pole piece connected to said second support means;

each of said adjustment means comprising a block, a differential screw connected between said block and one of said support means, and screw extending transversely of said support means and being operative to move said block in a transverse direction relative to said support means in response to rotation of said screw, and at least one pin operatively connected between said block and the other of said support means, said pin having a slight longitudinal angle of incline whereby the transverse movement of said block is translated into a slight longitudinal relative movement between said support means so as to pivot said pole face of said pole piece attached to said second support means about said pivot.

10. The combination of claim 9 wherein each adjustment mechanism comprises:

guide means connected to said one support means and slidingly engaged with said block for guiding movement thereof.

11. The combination of claim 9 comprising said other support means comprises means defining a bore slidingly receiving said pin and extending at the same angle of incline.

12. The combination of claim 11 wherein said bore defining means comprising a block adjustably mounted on said other support means.

* * * * *